(12) United States Patent
Norrie (10) Patent No.: US 8,935,598 B1
(45) Date of Patent: Jan. 13, 2015

(54) SYSTEM AND METHOD FOR ADAPTIVE CHECK NODE APPROXIMATION IN LDPC DECODING

(71) Applicant: PMC-Sierra US, Inc., Sunnyvale, CA (US)

(72) Inventor: Christopher I. W. Norrie, San Jose, CA (US)

(73) Assignee: PMC-Sierra US, Inc., Sunnyvale, CA (US)

( * ) Notice: Subject to any disclaimer, the term of this patent is extended or adjusted under 35 U.S.C. 154(b) by 133 days.

(21) Appl. No.: 13/797,444

(22) Filed: Mar. 12, 2013

(51) Int. Cl.
*H03M 13/00* (2006.01)
*H03M 13/13* (2006.01)

(52) U.S. Cl.
CPC ................................. *H03M 13/13* (2013.01)
USPC ........... 714/779; 714/755; 714/786; 714/780; 714/794; 375/341; 375/262

(58) Field of Classification Search
CPC ..................... H03M 13/1111; H03M 13/1117; H03M 13/112; H03M 13/1122; H03M 13/1137
USPC ................. 714/752, 746, 755, 758, 779, 786, 714/795–795, 804; 375/262, 341
See application file for complete search history.

(56) References Cited

U.S. PATENT DOCUMENTS

| | | | |
|---|---|---|---|
| 5,732,092 A | 3/1998 | Shinohara | |
| 6,115,788 A | 9/2000 | Thowe | |
| 6,539,515 B1 | 3/2003 | Gong | |
| 6,934,804 B2 | 8/2005 | Hashemi | |
| 6,976,194 B2 | 12/2005 | Cypher | |
| 6,976,197 B2 | 12/2005 | Faust et al. | |
| 7,206,992 B2 | 4/2007 | Xin | |
| 7,237,183 B2 | 6/2007 | Xin | |
| 7,484,158 B2 | 1/2009 | Sharon et al. | |
| 7,937,641 B2 | 5/2011 | Amidi | |
| 7,958,430 B1 | 6/2011 | Kolokowsky et al. | |
| 7,975,193 B2 | 7/2011 | Johnson | |
| 8,140,930 B1 * | 3/2012 | Maru | 714/752 |
| 8,176,367 B2 | 5/2012 | Dreifus et al. | |
| 8,219,894 B2 | 7/2012 | Au et al. | |
| 8,245,112 B2 | 8/2012 | Hicken et al. | |
| 8,245,117 B1 | 8/2012 | Wu | |
| 8,255,770 B2 | 8/2012 | Park et al. | |
| 8,261,136 B2 | 9/2012 | D'abreu et al. | |
| 8,281,227 B2 | 10/2012 | Thatcher et al. | |
| 8,286,004 B2 | 10/2012 | Williams | |
| 8,307,258 B2 | 11/2012 | Flynn et al. | |
| 8,327,220 B2 | 12/2012 | Borchers et al. | |
| 8,335,977 B2 | 12/2012 | Weingarten et al. | |
| 8,392,789 B2 | 3/2013 | Biscondi et al. | |
| 8,402,201 B2 | 3/2013 | Flynn et al. | |
| 8,418,023 B2 | 4/2013 | Gunnam et al. | |
| 8,429,497 B2 | 4/2013 | Tu et al. | |
| 8,504,887 B1 | 8/2013 | Varnica et al. | |
| 8,555,140 B2 | 10/2013 | Gunnam et al. | |
| 8,621,318 B1 | 12/2013 | Micheloni et al. | |
| 8,656,257 B1 | 2/2014 | Micheloni et al. | |

(Continued)

*Primary Examiner* — Guy Lamarre
(74) *Attorney, Agent, or Firm* — Kenneth Glass; Molly Sauter; Glass & Associates (57) ABSTRACT

A low-density parity check (LDPC) decoder is provided for decoding low-density parity check (LDPC) encoded data wherein an adaptive check node approximation is performed at the check node processor utilizing the smallest magnitude log-likelihood ratio (LLR) and the second smallest magnitude log-likelihood ratio (LLR) to adapt to the current conditions at the check node.

20 Claims, 9 Drawing Sheets

(56) References Cited

U.S. PATENT DOCUMENTS

| | | |
|---|---|---|
| 8,694,849 B1 | 4/2014 | Micheloni et al. |
| 8,694,855 B1 | 4/2014 | Micheloni et al. |
| 8,707,122 B1 | 4/2014 | Micheloni et al. |
| 2003/0033567 A1 | 2/2003 | Tamura et al. |
| 2003/0104788 A1* | 6/2003 | Kim ............................. 455/67.3 |
| 2004/0088636 A1 | 5/2004 | Cypher |
| 2004/0123230 A1* | 6/2004 | Lee et al. ....................... 714/800 |
| 2004/0252791 A1* | 12/2004 | Shen et al. ..................... 375/340 |
| 2005/0248999 A1 | 11/2005 | Tamura et al. |
| 2007/0050688 A1 | 3/2007 | Thayer |
| 2007/0089031 A1 | 4/2007 | Huffman et al. |
| 2008/0005382 A1 | 1/2008 | Mimatsu |
| 2008/0016425 A1 | 1/2008 | Khan et al. |
| 2008/0229079 A1 | 9/2008 | Flynn et al. |
| 2008/0229164 A1 | 9/2008 | Tamura et al. |
| 2008/0256292 A1 | 10/2008 | Flynn et al. |
| 2009/0327802 A1 | 12/2009 | Fukutomi |
| 2010/0199149 A1 | 8/2010 | Weingarten et al. |
| 2010/0211737 A1 | 8/2010 | Flynn et al. |
| 2010/0211852 A1 | 8/2010 | Lee et al. |
| 2010/0246664 A1 | 9/2010 | Citta et al. |
| 2010/0293440 A1 | 11/2010 | Thatcher |
| 2011/0072331 A1 | 3/2011 | Sakaue et al. |
| 2011/0246853 A1 | 10/2011 | Kim |
| 2011/0296084 A1 | 12/2011 | Nango |
| 2012/0051144 A1 | 3/2012 | Weingarten et al. |
| 2012/0054413 A1 | 3/2012 | Brandt |
| 2012/0311402 A1 | 12/2012 | Tseng et al. |
| 2013/0145235 A1 | 6/2013 | Aussien et al. |
| 2013/0163328 A1 | 6/2013 | Karakulak et al. |
| 2014/0053037 A1 | 2/2014 | Wang et al. |
| 2014/0072056 A1 | 3/2014 | Fay |

* cited by examiner

| First Smallest LLR | Second Smallest LLR | Result of Sum-Product Approximation | First Smallest LLR | Second Smallest LLR | Result of Sum-Product Approximation | First Smallest LLR | Second Smallest LLR | Result of Sum-Product Approximation |
|---|---|---|---|---|---|---|---|---|
| 0 | 0 | 0 | 12 | 12 | 9 | 21 | 30 | 21 |
| 1 | 1 | 0 | 12 | 13 | 10 | 22 | 22 | 19 |
| 1 | 5 | 1 | 12 | 16 | 11 | 22 | 23 | 30 |
| 2 | 2 | 0 | 12 | 21 | 12 | 22 | 26 | 21 |
| 2 | 3 | 1 | 13 | 13 | 10 | 22 | 31 | 22 |
| 2 | 8 | 2 | 13 | 14 | 11 | 23 | 23 | 20 |
| 3 | 3 | 1 | 13 | 17 | 12 | 23 | 24 | 21 |
| 3 | 5 | 2 | 13 | 22 | 13 | 23 | 27 | 22 |
| 3 | 10 | 3 | 14 | 14 | 11 | 24 | 24 | 21 |
| 4 | 4 | 2 | 14 | 15 | 12 | 24 | 25 | 22 |
| 4 | 7 | 3 | 14 | 18 | 13 | 24 | 28 | 23 |
| 4 | 12 | 4 | 14 | 23 | 14 | 25 | 25 | 22 |
| 5 | 5 | 3 | 15 | 15 | 12 | 25 | 26 | 23 |
| 5 | 8 | 4 | 15 | 16 | 13 | 25 | 29 | 24 |
| 5 | 13 | 5 | 15 | 19 | 14 | 26 | 26 | 23 |
| 6 | 6 | 3 | 15 | 24 | 15 | 26 | 27 | 24 |
| 6 | 7 | 4 | 16 | 16 | 13 | 27 | 27 | 24 |
| 6 | 9 | 5 | 16 | 17 | 14 | 27 | 28 | 25 |
| 6 | 14 | 6 | 16 | 20 | 15 | 27 | 31 | 26 |
| 7 | 7 | 4 | 16 | 25 | 16 | 28 | 28 | 25 |
| 7 | 8 | 5 | 17 | 17 | 14 | 28 | 29 | 26 |
| 7 | 10 | 6 | 17 | 18 | 15 | 29 | 29 | 26 |
| 7 | 15 | 7 | 17 | 21 | 16 | 29 | 30 | 27 |
| 8 | 8 | 5 | 17 | 26 | 17 | 30 | 30 | 27 |
| 8 | 9 | 6 | 18 | 18 | 15 | 30 | 31 | 28 |
| 8 | 12 | 7 | 18 | 19 | 16 | 31 | 31 | 28 |
| 8 | 16 | 8 | 18 | 22 | 17 | | | |
| 9 | 9 | 6 | 18 | 27 | 18 | | | |
| 9 | 10 | 7 | 19 | 19 | 16 | | | |
| 9 | 13 | 8 | 19 | 20 | 17 | | | |
| 9 | 18 | 9 | 19 | 23 | 18 | | | |
| 10 | 10 | 8 | 19 | 28 | 19 | | | |
| 10 | 11 | 9 | 20 | 20 | 17 | | | |
| 10 | 14 | 10 | 20 | 21 | 18 | | | |
| 10 | 19 | 8 | 20 | 24 | 19 | | | |
| 11 | 11 | 8 | 20 | 29 | 20 | | | |
| 11 | 12 | 9 | 21 | 21 | 18 | | | |
| 11 | 15 | 10 | 21 | 22 | 19 | | | |
| 11 | 20 | 11 | 21 | 25 | 20 | | | |

FIG. 4

| First Smallest LLR | Second Smallest LLR | Result of Sum-Product Approximation | First Smallest LLR | Second Smallest LLR | Result of Sum-Product Approximation | First Smallest LLR | Second Smallest LLR | Result of Sum-Product Approximation |
|---|---|---|---|---|---|---|---|---|
| 0 | 0 | 0 | 11 | 0 | 0 | 20 | 0 | 18 |
| 1 | 0 | 0 | 11 | 16 | 10 | 20 | 24 | 19 |
| 1 | 4 | 1 | 11 | 20 | 11 | 20 | 28 | 20 |
| 2 | 0 | 1 | 12 | 0 | 10 | 21 | 0 | 19 |
| 2 | 8 | 2 | 12 | 16 | 11 | 21 | 24 | 20 |
| 3 | 0 | 1 | 12 | 20 | 12 | 21 | 28 | 21 |
| 3 | 4 | 2 | 13 | 0 | 11 | 22 | 0 | 20 |
| 3 | 8 | 3 | 13 | 16 | 12 | 22 | 24 | 21 |
| 4 | 0 | 2 | 13 | 20 | 13 | 23 | 0 | 21 |
| 4 | 8 | 3 | 14 | 0 | 12 | 23 | 28 | 22 |
| 4 | 12 | 4 | 14 | 16 | 13 | 24 | 0 | 22 |
| 5 | 0 | 3 | 14 | 20 | 14 | 24 | 28 | 23 |
| 5 | 8 | 4 | 15 | 0 | 13 | 25 | 0 | 23 |
| 5 | 12 | 5 | 15 | 20 | 14 | 25 | 28 | 24 |
| 6 | 0 | 4 | 15 | 24 | 15 | 26 | 0 | 24 |
| 6 | 8 | 5 | 16 | 0 | 14 | 26 | 28 | 25 |
| 6 | 12 | 6 | 16 | 20 | 15 | 27 | 0 | 24 |
| 7 | 0 | 4 | 16 | 24 | 16 | 27 | 28 | 25 |
| 7 | 8 | 5 | 17 | 0 | 15 | 28 | 0 | 26 |
| 7 | 12 | 6 | 17 | 20 | 16 | 29 | 0 | 27 |
| 7 | 16 | 7 | 17 | 24 | 17 | 30 | 0 | 27 |
| 8 | 0 | 6 | 17 | 28 | 17 | 31 | 0 | 28 |
| 8 | 12 | 7 | 18 | 0 | 16 | | | |
| 8 | 16 | 8 | 18 | 20 | 17 | | | |
| 9 | 0 | 7 | 18 | 28 | 18 | | | |
| 9 | 12 | 8 | 19 | 0 | 17 | | | |
| 9 | 16 | 9 | 19 | 24 | 18 | | | |
| 10 | 0 | 8 | 19 | 28 | 19 | | | |
| 10 | 12 | 9 | | | | | | |
| 10 | 20 | 10 | | | | | | |

SYSTEM AND METHOD FOR ADAPTIVE CHECK NODE APPROXIMATION IN LDPC DECODING

BACKGROUND

A solid state drive (SSD) is a data storage device that utilizes solid-state memory to retain data in nonvolatile memory chips. NAND-based flash memories are widely used as the solid-state memory storage in SSDs due to their compactness, low power consumption, low cost, high data throughput and reliability. SSDs commonly employ several NAND-based flash memory chips and a flash controller to manage the flash memory and to transfer data between the flash memory and a host computer.

While NAND-based flash memories are reliable, they are not inherently error-free and often rely on error correction coding (ECC) to correct raw bit errors in the stored data. One commonly employed error correction code employed in nonvolatile memory storage modules, such as SSDs, are low-density parity-check (LDPC) codes. An LDPC code is a linear error correcting code having a parity check matrix with a small number of nonzero elements in each row and column.

Various methods for decoding data encoded with LDPC error correction codes are known in the art, including the sum-product algorithm (SPA) and the min-sum algorithm (MSA). While the sum-product algorithm (SPA) is known to achieve the best decoding performance, it is computationally complex. The min-sum algorithm (MSA) was introduced to reduce the computationally complexity inherent in the sum-product algorithm, however an undesirable performance degradation results when using the min-sum algorithm in comparison to the sum-product algorithm (SPA). To compensate for the errors in the estimations resulting from the min-sum algorithm, attenuation factors have been introduced into the min-sum calculations in an effort to bring the result of the min-sum algorithm closer to that of the optimum sum-product algorithm. However, it is difficult to anticipate what attenuation factor will give the desired result and, in the prior art, the attenuation factor is globally applied equally to all the min-sum estimations, which may not deliver an optimum result.

Accordingly, what is needed in the art is a decoding system and method having improved error correction capability over the min-sum algorithm (MSA) which also eliminates the global application of an indefinite attenuation factor in the decoding process of LDPC encoded data.

SUMMARY

In various embodiments, a nonvolatile memory system includes a nonvolatile memory storage module for storing encoded data. The encoded data stored in the nonvolatile memory storage module is encoded using a low-density parity check (LDPC) error correction code. A decoder receives the LDPC encoded data stored in the nonvolatile memory storage module and attempts to decode and recover the data.

A method for decoding low-density parity check (LDPC) encoded data is provided, which includes, receiving a plurality of log-likelihood ratios (LLRs) at a decoder, each of the plurality of LLRs representing one of a plurality of bits of an LDPC encoded codeword, identifying a smallest LLR from the plurality of received LLRs, the smallest magnitude LLR having the smallest magnitude of the plurality of received LLRs, identifying a second smallest LLR from the plurality of received LLRs, the second smallest LLR having the second smallest magnitude of the plurality of received LLRs that is equal to or greater than the smallest LLR, determining an adaptive check node approximation of the bits of the encoded codeword using the smallest LLR and the second smallest LLR and decoding the encoded codeword using the adaptive check node approximation of the bits of the encoded codeword to provide an estimate of the LDPC encoded codeword. After the adaptive check node approximations are determined, the results may be used to perform variable node processing and to perform a check of the estimate of the LDPC encoded codeword to determine if the codeword estimate is a valid codeword.

The plurality of LLRs may be received at a check node processor of the decoder from a nonvolatile memory storage module Alternatively, more than two smallest LLRs may be identified and utilized to determine the adaptive check node approximation.

In determining the adaptive check node approximation, a non-linear look-up table, storing a sum-product approximation of all the possible combinations of the smallest LLR and the second smallest LLR, may be used. Alternatively, a reduced non-linear look-up table, storing a sum-product approximation of all the possible combinations of the smallest LLR and a reduced number of the second smallest LLR, may be used.

In an alternate embodiment, the sum-product approximation may be determined from the smallest LLR and the second smallest LLR utilizing combinatorial decode logic circuitry.

An LDPC decoder for decoding low-density parity check (LDPC) encoded data is provided. The LDPC for receiving LDPC encoded data comprising a plurality of log-likelihood ratios (LLRs), each of the plurality of LLRs representing one of a plurality of bits of an LDPC codeword encoded using a parity check matrix. The decoder comprising a check node processor for determining an adaptive check node approximation of the LDPC codeword using a smallest magnitude LLR of the plurality of LLRs and a second smallest magnitude LLR of the plurality of LLRs that is equal to or greater than the smallest magnitude LLR.

The LDPC decoder may further include a variable node processor coupled to the check node processor, the variable node processor having circuitry for performing variable node processing from the check node processing results and a codeword estimate check processor coupled to the variable node processor, the codeword estimate check processor having circuitry for performing a check of the estimate of the LDPC encoded codeword to determine if the codeword estimate is a valid codeword.

The system and method of the present invention provide for an adaptive check node approximation at the check node of a decoder that adapts to the current conditions at the check node. In the present invention, the smallest LLRs (i.e. the most significant LLRs) are used to approximate the adaptive check node approximation result at the check node. The adaptive check node approximation at the check node reduces the hardware requirements of the decoder and also provides for improved error correction capability over the min-sum algorithm (MSA), thereby eliminating the need for global application of an indefinite attenuation factor in the decoding process of LDPC encoded data.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

DETAILED DESCRIPTION

In the operation of a stored channel utilizing LDPC encoding, original data are stored in a non-volatile memory. Different noise sources estimated as White Gaussian Noise (AWGN) Channel corrupt the original stored message resulting in a one becoming a zero or vice versa. To improve the bit error rate, BER, the SSD write controller may comprise an LDPC encoder which multiplies an information bit vector with a generator matrix G of the LDPC code. The output of the encoder is then stored in a nonvolatile memory system. During the read operation, the nonvolatile memory system provides the stored codewords to an LDPC decoder which performs the LDPC decoding process.

The nonvolatile memory system used in the communication system may be a NAND-based flash memory system. While NAND-based flash memories are reliable, they are not inherently error-free and often rely on error correction coding (ECC) to correct raw bit errors in the stored data. Various mechanisms may lead to bit errors in flash memories, including noise at the power rails, voltage threshold disturbances during the reading and/or writing of neighboring cells, retention loss due to leakage within the cells and tunneling. Error correction codes (ECC) are commonly employed in flash memories to recover stored data that is affected by such error mechanisms. In operation, ECC supplements the user data with parity bits which store enough extra information for the data to be reconstructed if one or more of the data bits are corrupted. Generally, the number of data bit errors detectable and correctable in the data increases with an increasing number of parity bits in the ECC. In many memory devices, data is stored in a memory location of the memory device along with the ECC for the data. In this way, the data and the ECC may be written to the memory location in a single write memory operation and read from the memory location in a single read memory operation. ECC is typically implemented in the flash memory controller.

NAND flash memories are based on floating gate storage. In floating gate storage technologies, two logic states are achieved by altering the number of electrons within the floating gate. The difference between the two logic states (1 and 0) is on the order of few electrons and is decreasing as the floating gate storage technology advances. The decreasing number of electrons responsible for the difference between the two logic states results in an increased probability of errors in the flash memory cell requiring more error correction. The fraction of data bits that are known to be corrupted, and therefore contain incorrect data, before applying the ECC is referred to as the raw bit error rate (RBER). As a result of the advances in the floating gate storage technology, the RBER for a flash page of memory cells is increasing and at technologies with feature sizes in the 1x range (below 20 nm) is nearing the Shannon Limit of the communication channel. The increased probability of errors in the stored data results in an increase in the error code correction necessary to correct the bit errors in the flash memory. The error rate observed after application of the ECC is referred to as the uncorrectable bit error rate (UBER). The acceptable UBER is often dependent upon the application in which the SSD is employed. In the case of price sensitive, consumer applications, which experience a relatively low number of memory accesses during the SSD product lifetime, the SSD may tolerate a higher UBER as compared to a high-end application experiencing a relatively high number of memory accesses, such as an Enterprise application.

To achieve an acceptable UBER for Enterprise applications employed in a flash storage controller, low-density parity-check (LDPC) error correction coding is commonly used. An LDPC code is a linear error correcting code having a parity check matrix with a small number of nonzero elements in each row and column. LDPC codes are capacity-approaching codes that allow the noise threshold to be set very close to the Shannon limit for a symmetric, memory-less channel. The noise threshold defines an upper bound for the channel noise, up to which the probability of lost information can be made as small as desired.

Figure 1:
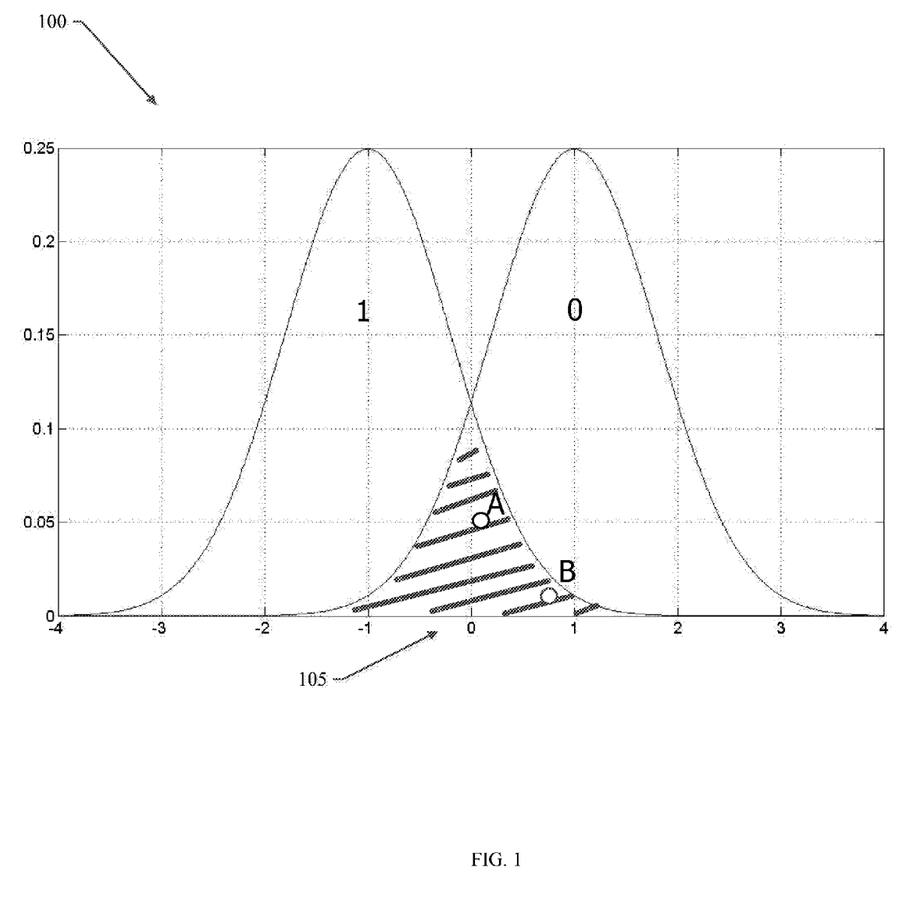
FIG. 1 is graphical illustration of the distribution overlap in the two voltage distributions used for decoding.

The power of LDPC codes resides in the ability of the decoding strategy to exploit the soft information on the stored data. In LDPC decoding, the two voltage distributions represent the two possible states: "0" and "1", of the cells within the NAND chips. When the voltage distributions overlap 105, as shown with reference to the graph 100 of FIG. 1, errors arise. A hard-decision decoder will read all the positive values as 0 and all the negative values as 1. So, in the situation depicted in the graph 100, the overlap region 105 will be composed of read errors. However, observing error points A and B within the overlap region 105, it is clear that the error points may vary in magnitude. The farther away the error points are from the reference voltage 205, the more probable it is that the cell contains the value that was stored. For example, point A is slightly to the right of the reference voltage and as such, slightly positive, while point B is farther away from zero. As such, it is more likely that point A carries the greater error because correct values should not be close to the reference voltage. Alternatively, point B is considered to carry less error than point A and is more likely to be read correctly. By exploiting the exact value of point A and point B, differentiation can be used between the two points and better information can then be provided to the decoder, resulting in improved decoding performance of the decoder in decoding the LDPC encoded codewords. Estimations of the exact value of point A and point B are referred to as soft information, which may be expressed by a log likelihood ratio (LLR). As such, in FIG. 2, error point A would be presented to the LDPC decoder as a value of zero and assigned a low magnitude LLR (probability) due to its close proximity to the reference voltage 205, whereas error point B would be presented to the LDPC decoder as a value of zero and assigned a moderate magnitude LLR (probability) due to its greater distance from the reference voltage 205. The read errors are not binary in nature, but instead vary from an ideal voltage according to an analog function. LDPC decoders have the ability to address this non-binary behavior using LLRs. The LLR attributed to a bit is representative of the probability that the voltage value read corresponds to a 0 or a 1. In the case of a NAND chip exhibiting a low noise case, a corresponding low raw bit error rate (RBER) will exist wherein most LLRs will have a large magnitude, while only a few LLRs will have a small magnitude.

LDPC decoding is performed based upon a parity check matrix which consists of "0"'s and "1"'s that define the parity check equations. An M×N parity check matrix (H) comprises M rows and N columns. The number of columns N corresponds to the number N of codeword bits within one encoded codeword and the codeword comprises a plurality of information bits (K) and M parity check bits. The number of rows within the parity check matrix corresponds to the number M of parity check bits in the codeword.

The decoding of the LDPC codes is an iterative process that uses as input, the LLR of the received data bits in the codeword, as in the equation:

$$LLR(x) = \log\left[\frac{p(x|y=0)}{p(x|y=1)}\right]$$

where "x" is the read message and "y" is the original codeword. When performing decoding of the codeword, the LLRs are propagated and updated between the variable nodes and the check nodes in a Tanner graph which is representative of the parity check matrix of the LDPC code.

Figure 2A:
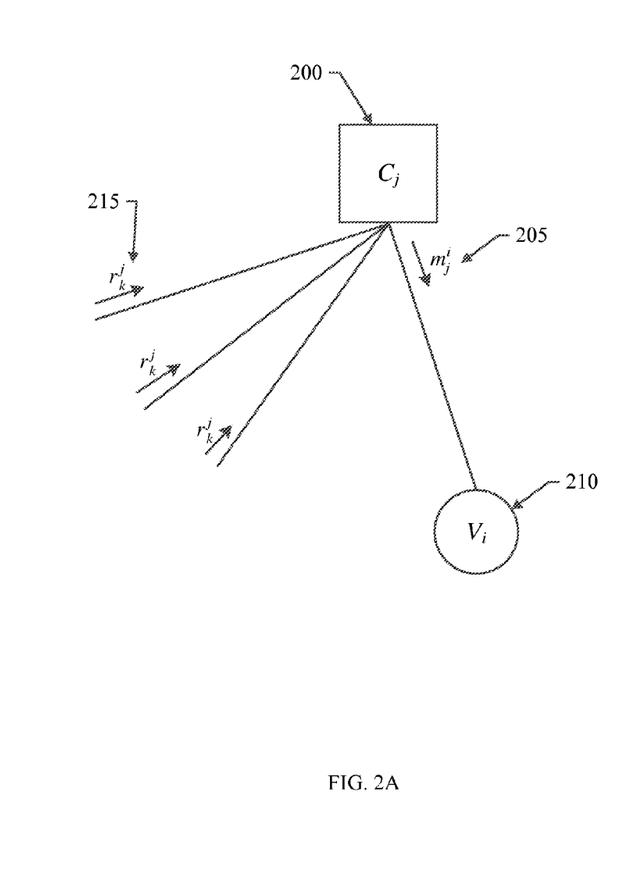
FIG. 2A is a diagram illustrating check node processing within an LDPC parity check matrix.
Figure 2B:
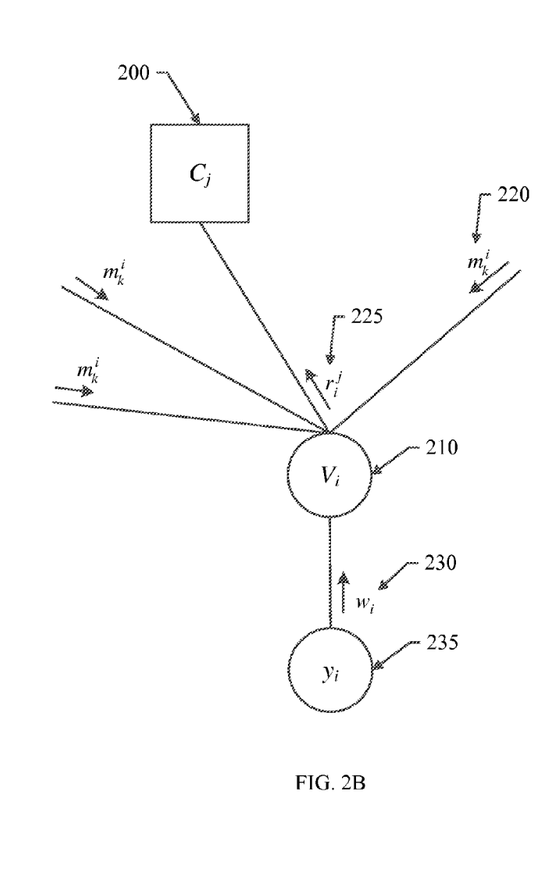
FIG. 2B is a diagram illustrating variable node processing within an LDPC parity check matrix.

With reference to FIG. 2, it is useful to think of the parity check matrix used for LDPC decoding in terms of its equivalent Tanner graph. A Tanner graph is a bipartite graph used to state constraints or equations which specify error correcting codes. In a Tanner graph representative of the parity check matrix, there are M=N−K check nodes C, one check node for each check equation, and N variable nodes, one variable node for each codeword bit. During the decoding process, the M check nodes and N variable nodes iteratively exchange information between themselves according to the LDPC decoding algorithm. The "1"'s in the parity check matrix determine the connections between the check nodes and the variable nodes. Iterative information exchange is performed only between the check nodes and the variable nodes that are connected to each other as defined in the parity check matrix.

In the check node processing phase of the decoding as illustrated in FIG. 2A, each check node ($C_j$) 200 computes values ($m_j^i$) 205 to be sent to the variable nodes ($V_i$) 210 to which the check node 200 is connected as defined by the parity check matrix. Each time the check node 200 computes the value 205, only extrinsic information is taken into account. In other words, the value $m_i$ is computed using all the values sent by the variable nodes connected to that check node $r_k^j$ 215, except variable node i, according to the following formulas:

$$m_j^i = \prod_{k \in N(j)\backslash\{i\}} \text{sign}(r_k^j) \cdot \phi\left(\sum_{k \in N(j)\backslash\{i\}} \phi(|r_k^j|)\right)$$

$$\phi(x) = -\log\left(\tanh\left(\frac{x}{2}\right)\right)$$

A similar concept is applied to variable node processing in accordance with the parity check matrix as shown with reference to FIG. 2B. In variable node processing, the value $r_j$ 225, representing the codeword estimate, is computed using all the values $m_k^i$ 220 sent by the check nodes connected to the variable node 210, except check node j 200 and the input LLRs 230 read from the NAND cells 235, according to the following formula:

$$r_j^i = w_i + \sum_{k \in N(i)\backslash\{j\}} m_k^i$$

Following each iteration of the check node processing and variable node processing steps, the resulting codeword estimate (r) is checked to verify that it is a valid codeword by multiplying it by the transpose of the parity check matrix (H). If the result is null, then r is a considered a valid codeword and the decoding is complete. If the result is not null, then the decoding is not considered complete and a new iteration is started.

The message passing computation rule procedure as described above is referred to as a belief propagation (BP) computation rule and is also commonly known as the sum-product algorithm (SPA). While the sum-product algorithm is known to achieve the best decoding performance, it is computationally complex. The formula used in check node processing following the sum-product algorithm is a very complex formula involving both the tan h and the log function which are difficult to implement in hardware necessary to compute the check node formula. The computational complexity of the SPA necessitates a decoding device having a large number of logic gates, resulting in an increased cost and decreased power efficiency of the device.

In the sum-product algorithm, the φ function produces a very large result for small values of x (input LLRs) and a very small result for large values of x (input LLRs). In general, as x approaches zero, φ(x) approaches infinity and as x increases from zero, φ(x) rapidly decreases in value.

When a check node receives the extrinsic input LLRs, the majority of the information will have originated from reasonably reliable sources, because most of the variable nodes associated with the check node will have large LLR magnitudes, representing a high probability that the message read from the memory is the original codeword that was stored. When only a small amount of noise has affected the stored bits, and as such the raw bit error rate (RBER) is low, the majority of LLRs will tend to have a large magnitude, while only a few LLRs will have a small magnitude. For example, at a raw bit error rate (RBER) of 1 e-3, an average of only 1 in 1000 bits is in error. As such, all the extrinsic information operated on by the check nodes will have large LLR magnitudes except for the check nodes that process bits that are in error. However, even in the case where the check node is processing bits that are in error, it is likely that only 1 of the extrinsic sources for that particular check node has a small LLR magnitude. The small LLR magnitude of that one extrinsic source will have the greatest effect on the φ function, as previously discussed. As a result of the complexity of the sum-product algorithm, and the assumption that the smallest extrinsic value approximates all extrinsic values received by a check node, approximated decoders utilizing a min-sum algorithm (MSA) have been developed where the φ function is computed as a minimum among the magnitudes of a set of values according to the formula:

$$m^i_j = \prod_{k \in N(j) \setminus \{i\}} \text{sign}(r^j_k) \cdot \min_{k \in N(j) \setminus \{i\}} |r^j_k|$$

However, since utilizing this formula yields an approximation to the full sum-product algorithm (SPA), an attenuation, or normalization, factor (a) is introduced into the MSA computation as:

$$m^i_j = \alpha \cdot \prod_{k \in N(j) \setminus \{i\}} \text{sign}(r^j_k) \cdot \min_{k \in N(j) \setminus \{i\}} |r^j_k|$$

In the normalized min-sum algorithm, the complicated computation of the tan h function and the log function are replaced with a simple minimum value finding operation at the cost of decoding performance. The loss of decoding performance is then recovered by applying a normalizing factor or attenuation factor to the check node processing outputs to improve the error performance.

For example, assuming a typical low noise situation wherein one small magnitude LLR and three larger magnitude LLRs are received as a series of four extrinsics as 0.1, 3, 3 and 3. The associated φ(x) for these received extrinsics would be 3.00, 0.01, 0.01 and 0.01, respectively, then the sum of the φ values for these extrinsics would be equal to 3.03 and the φ of the sum would be equal to about 0.1. The min-sum algorithm estimation would also result in a value of 0.1 by ignoring the last three LLRs (3, 3, 3) and considering only the smallest magnitude LLR (0.1). As such, in a low noise situation the assumption can be made that the smallest extrinsic value approximates all extrinsic values received by a check node and the min-sum algorithm will provide a close approximation without requiring any additional attenuation. In general, very little attenuation is required in a low noise situation.

In contrast, in a higher noise situation wherein a series of four received extrinsics are 0.1, 1, 1 and 1, the sum of the φ of the received extrinsics is 3+(3*.77)=5.3 and φ(5.3) is equal to 0.01, the output of the check node processing utilizing SPA would be 0.01. However, utilizing the min-sum approximation, the output of the check node processing would be equal to 0.1, which is not a close approximation to the SPA result. As such, in a higher noise situation, the min-sum result will require greater attenuation to more closely approximate the SPA result. In general, attenuating the min-sum result when there is more noise tends to increase the accuracy of the approximation towards the correct check node result.

While in the case of low RBER the min-sum approximation closely approximates the sum-product algorithm (SPA), in the case of high RBER, the approximation may not resemble the sum-product algorithm because the assumption that only 1 extrinsic is small may not be accurate. As such, in the case of high RBER, the min-sum check node calculation may be a poor approximation to the real φ function result of the sum-product algorithm (SPA). In the case of high RBER, the full min-sum check node calculation will generate a result that is noticeably larger than the sum of φ result of the sum-product algorithm, which translates to a higher than optimal estimate of the likelihood of which bits are in error versus which are not in error. As such, at high RBER the min-sum calculation tends to be overly optimistic when compared to the sum-product calculation.

To compensate for the overly optimistic estimation inherent in the min-sum algorithm (MSA), it is known to incorporate an attenuation factor into the min-sum algorithm (MSA) estimate. The addition of the attenuation factor may or may not improve the estimate of the likelihood of which bits are in error versus which are not in error because it is difficult to determine the optimum attenuation factor to be used in the min-sum algorithm decoding process due to possible unknown lifetime characteristics of the flash device and unknown noise conditions.

Additionally, in the current state of the art, the attenuation factor for the min-sum algorithm (MSA) is applied globally to all the check node calculations. Global application of the attenuation factor may not lead to an optimal result because some check nodes may require more or less attenuation than other check nodes and some check nodes may not benefit at all from any level of attenuation. While some check nodes may be operating on many highly reliable bit node estimates and may not require any attenuation, other check nodes may be operating on several highly unreliable bit node estimates that may require more attenuation. As such, depending upon the individual check node, a different attenuation may be desirable to improve the approximation, however in the state of the art, min-sum attenuation is not check node specific and all check nodes will be subjected to the same attenuation.

In accordance with the present invention, instead of assuming that all the check nodes will benefit from the same amount of attenuation and globally applying a non-optimum attenuation factor to all the check nodes, the present invention adapts the attenuation level to the specific condition at each individual check node. The use of an adaptive attenuation at each individual check node allows every check node to produce its own optimized result, thereby improving the overall error correction capability of the decoder.

As previously discussed, the min-sum approximation is most accurate when the check node receives only one small LLR and the remaining LLRs are large. The min-sum approximation result drifts farther from the optimum sum-product result as the magnitude of the second smallest LLR at the check node approaches the magnitude of the smallest LLR. Based upon this observation, the present invention utilizes the smallest LLR and the second smallest LLR and a sum-product approximation to calculate the result.

To avoid the computationally intense requirements of the sum-product algorithm (SPA) in calculating and summing the results of the φ function for all of the input LLRs received by the check node, the present invention proceeds by first identifying the smallest magnitude LLR and the second smallest magnitude LLR received at the check node and then performs a sum-product algorithm (SPA) approximation utilizing only the smallest magnitude LLR and the second smallest magnitude LLR as operands. The resulting output LLR is then sent to the variable nodes connected to the check node for further processing.

In accordance with the present invention, each check node result is adaptively attenuated independently based upon the current conditions at the check node and the check node itself determines the optimum amount of attenuation to apply to the result. The attenuation for each of the check nodes is accomplished by incorporating the second smallest LLR into the estimate, such that the estimate is a closer approximation to the optimum sum-product algorithm (SPA) as compared to the min-sum algorithm (MSA) using global attenuation of the check nodes.

In the present invention, since all the combinations of the smallest magnitude LLR and the second smallest magnitude LLR are known for a given number of bits in the codeword, all the combinations of the smallest magnitude LLR and second smallest magnitude LLR for a specific application can be identified and the sum-product approximation result for all the combinations of the smallest LLR and the second smallest LLR can be calculated and stored in a look-up table. The check node processor can then extract the resulting output LLR by indexing the look-up table using the smallest magnitude LLR and the second smallest magnitude LLR. As such, utilizing a look-up table, all the possible output bits can be pre-calculated and stored in memory based upon all the combinations of pre-determined input bits.

In an alternative embodiment, the resulting output LLR may be determined using combinatorial decode process using the smallest magnitude LLR and the second smallest magnitude LLR.

Figure 3:
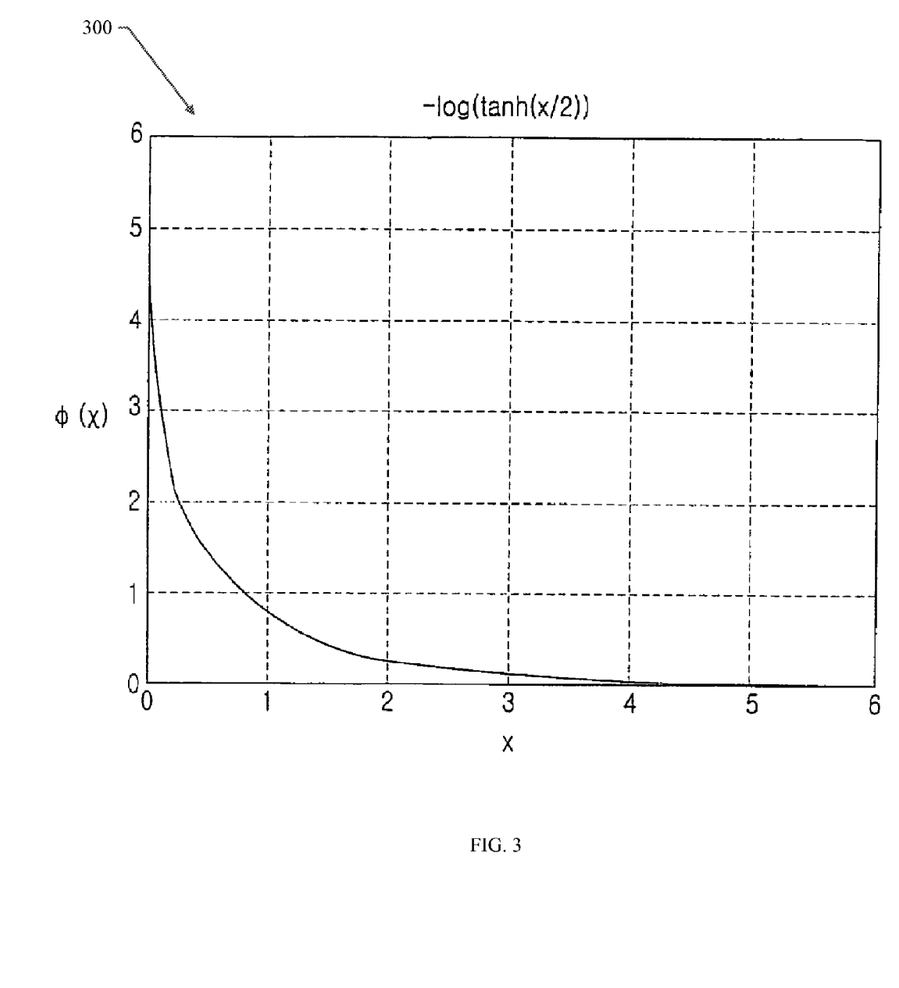
FIG. 3 is a graph illustrating the $\phi$ function of x.

FIG. 3 illustrates the result of the $\phi$ function for various values of x. As shown in the FIG. 300, there is very little variability in the result of the $\phi$ function for large magnitudes of x. Alternatively, there exists a great deal of variability in the result of the $\phi$ function for smaller magnitudes of x. As such, it is desirable to have more discrimination at the lower magnitudes of x and less discrimination at the higher magnitudes of x. For very large magnitudes of x, it is therefore possible to reduce the size of the look-up table by eliminating those entries and to establish a non-linear look-up table containing more indexed elements at low magnitudes of x and fewer indexed elements at high magnitudes of x.

Figure 4:
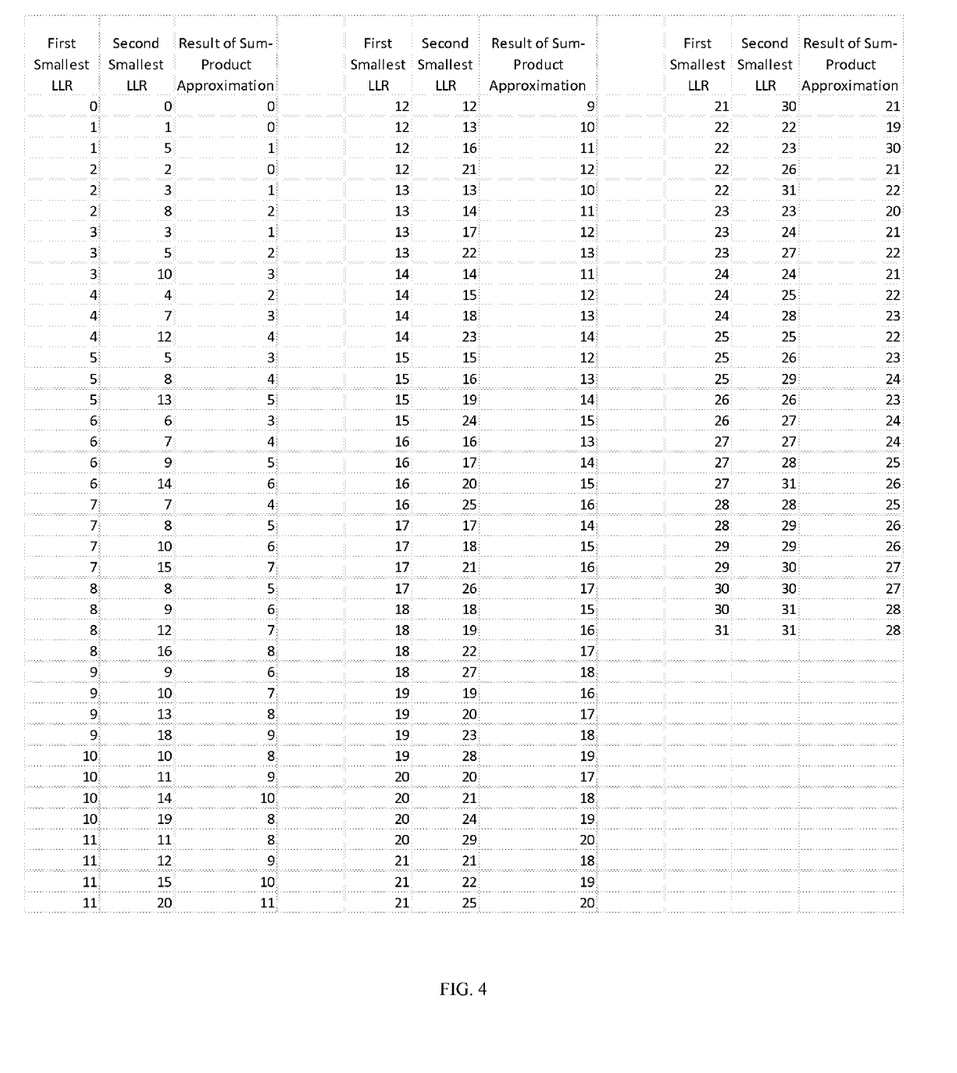
FIG. 4 is a listing of the $\phi$ approximation result for all given combinations of a first smallest magnitude LLR and second smallest magnitude LLR at a check node.
Figure 5:
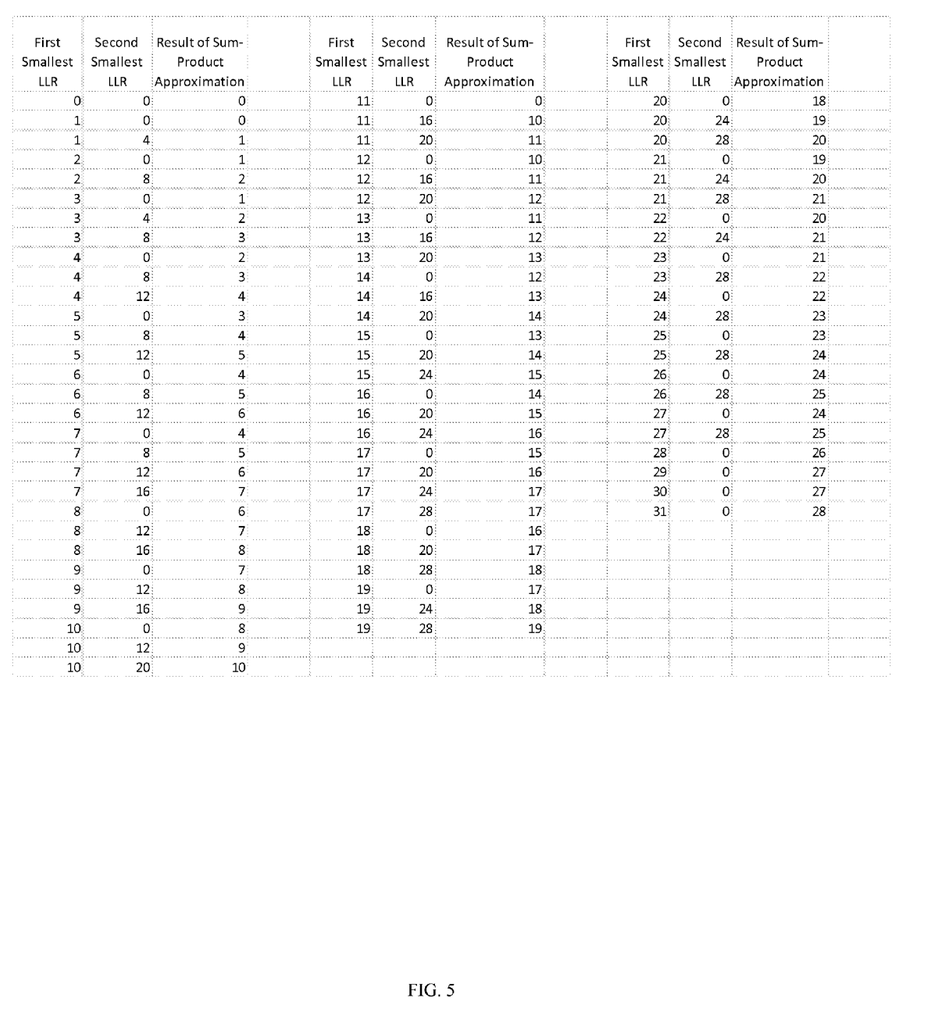
FIG. 5 is a listing of the $\phi$ approximation result for the given combinations of a first smallest magnitude LLR and second smallest magnitude LLR at a check node, wherein the second smallest magnitude LLR are reduced to 0, 2, 4, 8, 12, 16, 20, 24 and 28.

In performing the sum-product approximation using the two smallest LLRs, the approximating function can be implemented in a non-linear look-up table that includes the calculated results given every possible combination of the two smallest LLRs that can occur. In an exemplary embodiment, as shown with reference to FIG. 4, considering received bits from a codeword having 3 integer bits of precision and 2 fractional bits of precision, the sum-product algorithm is performed using every possible combination of the two smallest LLRs as the operands and, after reducing the full mathematical result from the floating point format to the original level of precision, the resulting LLRs are stored in a non-linear look-up table. The look-up table is then indexed by the first smallest LLR and the second smallest LLR during the check node decoding process to extract the LLR result. For simplicity, in the table of FIG. 4 and FIG. 5, the result of the sum-product algorithm has been multiplied by four to eliminate the binary point. As such, an LLR magnitude of 7 means 7/4=1.75, indicating that a binary 7 (111) and a binary 1.75 (1.11) are equivalent when the binary point is eliminated. Additionally, the tables of FIG. 4 and FIG. 5 illustrate the combinations of LLRs resulting in a change in the sum-product approximation. As such, in the table of FIG. 4, when the first smallest LLR is 1 and the second smallest LLR is 1 the sum-product approximation is 0, which is also true when the first smallest LLR is 1 and the second smallest LLR is 2, 3 or 4. When the second smallest LLR becomes a 5, the sum-product approximation becomes a 1, and this stays true for the range of the second smallest LLR between 6 and 31 and also when the smallest LLR changes to a 2 and the second smallest LLR is a 0 or a 1. As such, the tables of FIG. 4 and FIG. 5 only show the combinations of the first smallest LLR and the second smallest LLR where a change occurs in the sum-product approximation. In between the entries shown in the table, it is assumed that the value remains the same as the previous sum-product approximation.

In an alternative embodiment, the sum-product approximation using all the possible combinations of the two smallest LLRs as the operands could be performed using combinatorial decode logic in place of the look-up table to identify the resulting LLRs.

When utilizing look-up tables, it is desirable to reduce the size of the look-up table to reduce the necessary storage requirements for the hardware implementation. The number of entries in the look-up table can be reduced by identifying the second smallest magnitude LLRs that significantly contribute to the result and only providing entries in the table for these identified results. With reference to FIG. 5, for the codeword having 3 integer bits of precision and 2 fractional bits of precision, the look-up table can reduced by only considering results wherein the second smallest magnitude LLR is equal to 0, 4, 8, 12, 16, 20, 24 and 28. By identifying the second smallest magnitude LLRs in the combination of the first and second smallest LLRs that will be significant to the result, it is possible to eliminate the need to consider situations wherein the second smallest LLR is not equal to 0, 4, 8, 12, 16, 20, 24 and 28, thereby reducing the size of the look-up table.

As shown with reference to the table of FIG. 5, in selecting the significant values for the second smallest LLR, all the remaining values possess only a few "1" bits in their binary value. Additionally, the second smallest LLRs are selected so that the error they introduce into the approximation is kept small. The identification of these significant values will reduce the complexity of a combinatorial logic decode circuit and lead to a dramatically simplified combinatorial decoder.

While in the present embodiment, the use of the two smallest LLRs to make the sum-product approximation has been described, it is within the scope of the present invention to include additional LLRs in the approximation, such as the third smallest LLR. Utilizing additional next smallest LLRs in the approximation may be beneficial in high noise conditions.

The adaptive check node approximation utilizing the first smallest LLR value and the second smallest LLR value in accordance with the present invention may be used to improve the performance of the LDPC decoder in decoding LDPC encoded data that is stored in a nonvolatile memory system. As shown with reference to FIG. 6, a nonvolatile memory system 600, such as a solid state drive, may include a nonvolatile storage module 615 and a nonvolatile memory controller 605. The nonvolatile memory storage module 615 may comprise a plurality of NAND chips 630. Each of the plurality of NAND chips 630 may be coupled to the nonvolatile memory controller 605 through a plurality of channels 620. In this embodiment, the NAND chips 630 store the encoded codewords and the nonvolatile memory controller 605 is designed to execute reading and writing controls for the NAND chips 630 according to reading and writing instructions received from an access device.

Figure 6:
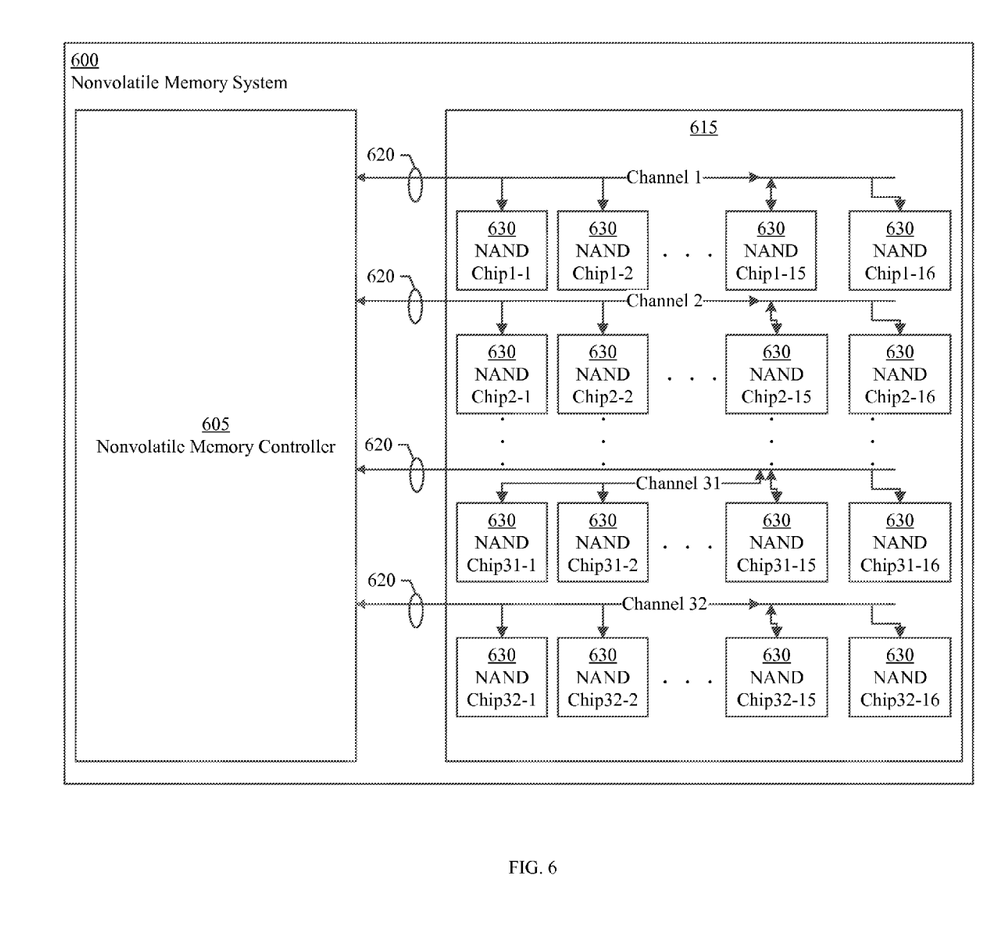
FIG. 6 is a block diagram illustrating a nonvolatile memory system.
Figure 7:
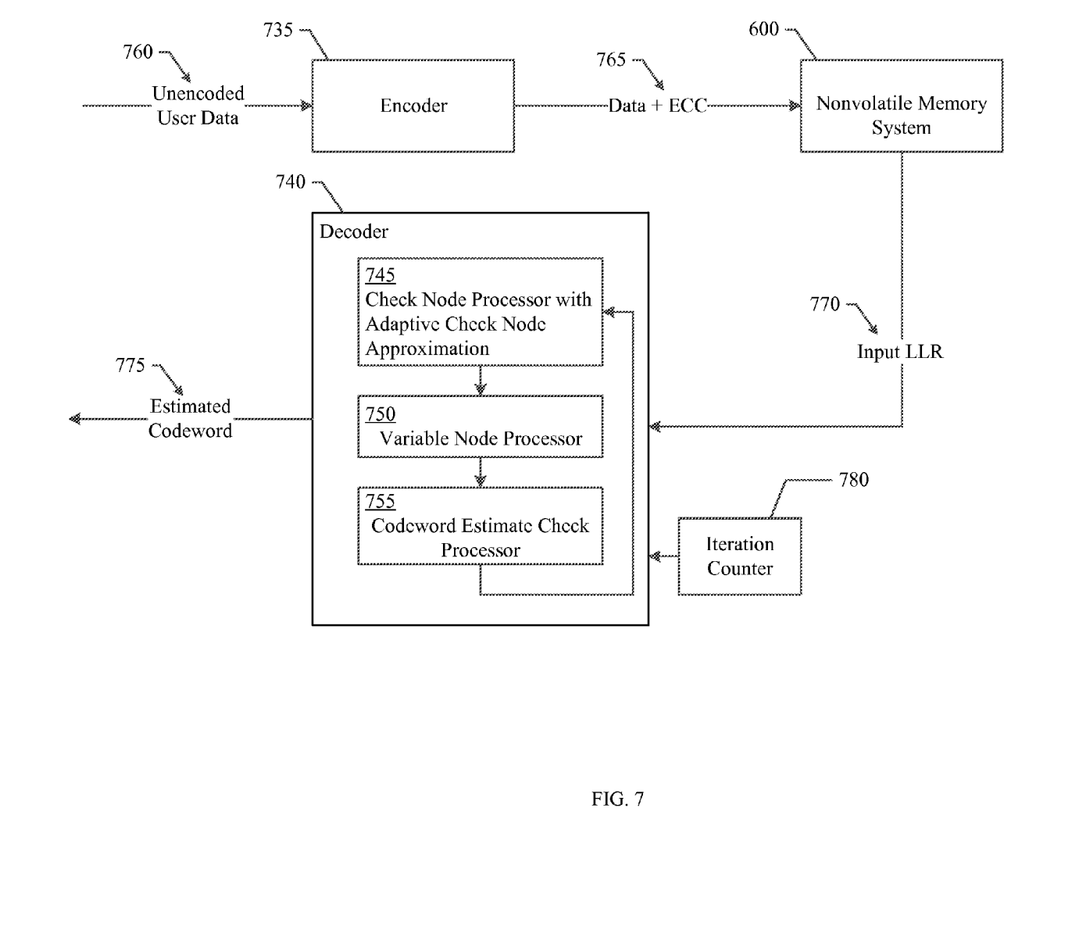
FIG. 7 is a block diagram illustrating LDPC encoding and LDPC decoding in accordance with an embodiment of the present invention.

The nonvolatile memory system 600 of FIG. 6 may be incorporated into a LDPC system as shown with reference to FIG. 7. As shown, the LDPC system may comprise an encoder 735 that is responsible for adding the parity bits to the unencoded user data 760 in accordance with a low-density parity check (LDPC) code. The LDPC encoded data 765, which includes the unencoded user data 760 and an error correction code, may then be stored as encoded codewords in the nonvolatile memory system 600. In a particular embodiment the nonvolatile memory system 600 may include a plurality of NAND chips 630 and a nonvolatile memory controller 605 as previously described with reference to FIG. 6.

In the present invention, LDPC decoding of the codeword is performed based upon the parity check matrix and an adaptive check node approximation. The parity check matrix consists of "0"s and "1"s defining the parity check equations. For an "M" row x "N" column parity check matrix, M check nodes and N variable nodes iteratively exchange messages between each other according to the LDPC decoding algorithm. The "1"s in the parity check matrix define the connections between the variable nodes and the check nodes and the exchange of information is performed only between the nodes connected to each other as defined by the parity check matrix. The present invention employs an adaptive check node approximation which utilizes the first smallest magnitude LLR and the second smallest magnitude LLR to approximate the sum-product algorithm and eliminates the need for attenuation as is often used in the min-sum approximation.

In operation of the present invention, during a read operation of the nonvolatile memory system 600, multiple reads of the stored codewords are executed to provide soft information represented by LLRs 770 as previously described. The input LLRs 770 are used as input to the LDPC decoder 740 to decode the unencoded user data 760 and encoded by, the encoder 735, utilizing LDPC coding following a parity check matrix (H). The received LLR values for each variable node are taken as the initial variable node messages.

Figure 8A:
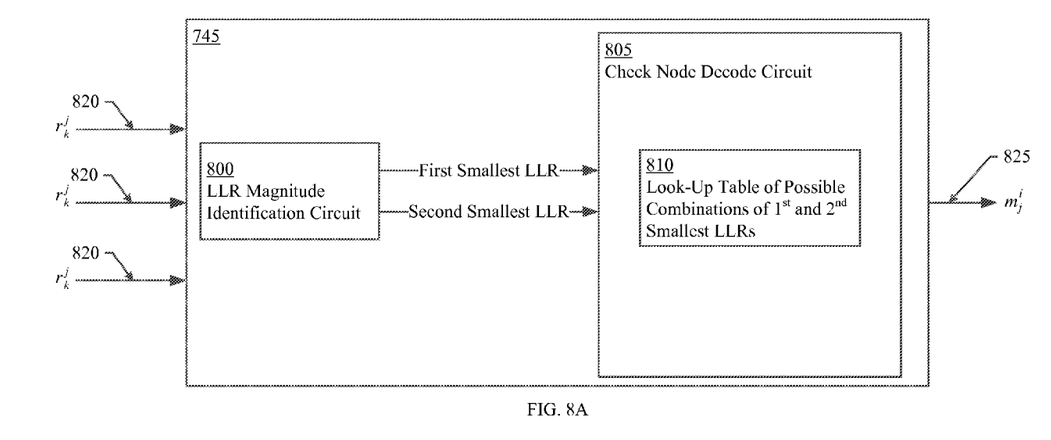
FIG. 8A is a block diagram illustrating a check node processor in accordance with an embodiment of the present invention.
Figure 8B:
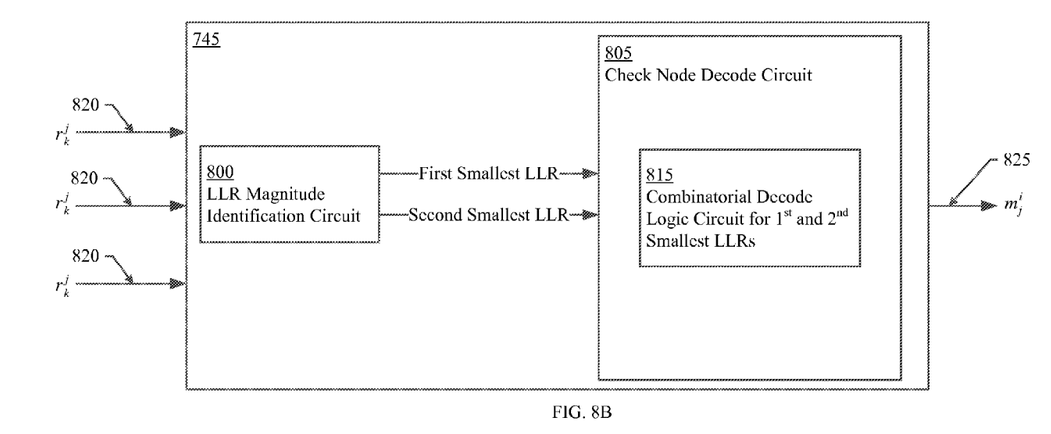
FIG. 8B is a block diagram illustrating a check node processor in accordance with an embodiment of the present invention.

As shown with reference to FIGS. 8A and 8B, the check node processor 745 comprises an LLR magnitude identification circuit 800 that identifies the first smallest magnitude LLR and the second smallest magnitude LLR from the received LLR values. The check node decode circuit 805 uses the first smallest magnitude LLR and the second smallest magnitude LLR to update the check nodes with the variable node messages to which they are connected. The check node decode circuit 805 may employ a non-linear look up table 810 containing possible combinations of the first smallest LLR and the second smallest LLR to determine the result 825, as shown in FIG. 8A. Alternatively, the check node decode circuit 805 may employ a combinatorial decode logic circuit 815 for the first smallest LLR and the second smallest LLR to determine the result 825, as shown with reference to FIG. 8B. The result 825 of the check node processor 745 is then passed to the variable node processor 750 and the variable node processor 750 then updates each variable node with the check node messages to which they are connected. The decoding process continues in this way, utilizing the adaptive check node approximation, resulting in a codeword estimate. The codeword estimate is checked by a codeword estimate check processor 755, to verify whether or not the codeword estimate is a valid codeword. In a particular embodiment, the codeword estimate may be multiplied by the parity check matrix to determine the syndrome and if the syndrome is zero, it may be determined that the codeword estimate is a valid codeword. If the codeword estimate is a valid codeword, the decoding is complete and the estimated codeword is provided as output 775 from the decoder 740. If it is determined by the codeword estimate check processor 755 that the codeword estimate is not a valid codeword, a second iteration of the decoding begins. The iteration counter 780 may be used to track the number of iterations of the decoding process and may cause the decoding to terminate if a maximum number of iterations is reached.

Figure 9:
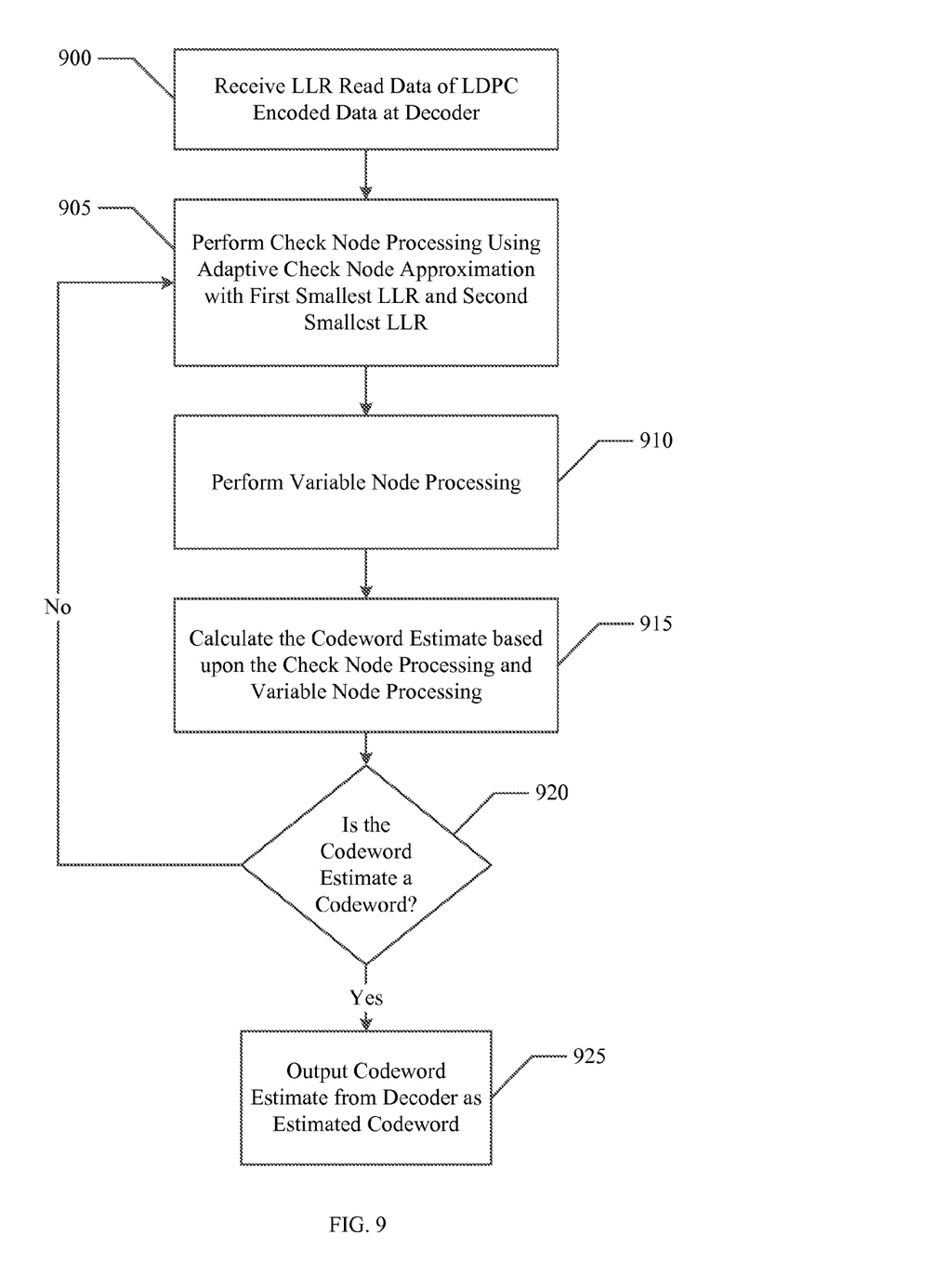
FIG. 9 is a flow diagram illustrating the decoding method in accordance with the present invention.

With reference to FIG. 9, in a particular embodiment of the present invention, LLR read data of the LDPC encoded data may be received at an LDPC decoder 900. In a particular embodiment, the LLRs may be read from a nonvolatile memory storage, such as a solid state drive (SSD) comprising a plurality of NAND chips. As previously described, iterative decoding is performed using the LLRs of the LDPC codeword. In iterative decoding, the check node processor 745 of the decoder 740 performs adaptive check node approximation processing for the LDPC parity check matrix using the first smallest LLR and the second smallest LLR 905. The messages resulting from the check node processing are passed to the variable node processor and the variable node processor 750 of the decoder 740 then performs variable node processing 910 and produces a codeword estimate based upon the check node processing and variable node processing 915. The codeword estimate check processor 755 of the decoder 740 then checks to verify that the codeword estimate is a valid codeword 920. If the codeword estimate is determined to be a codeword, the codeword estimate is transmitted from the decoder as an estimated codeword 925. However, if the codeword estimate is not determined to be a valid codeword, a next iteration of the decoding process is initiated beginning with the check node processing step 905.

In accordance with the present invention, the error performance of the LDPC decoder is improved by using an adaptive check node approximation of the sum-product algorithm. The method of the present invention provides a more accurate result than that attainable with the min-sum algorithm, while also eliminating the need for the global application of an attenuation factor as is often utilized in the min-sum algorithm to reach the desired error correction rate for the flash device. Additionally, utilizing a reduced non-linear look-up table, the decoder of the present invention provides reduced computational complexity and a simplified hardware implementation.

In the simulations performed with the adaptive check node approximation of the present invention, no specific decode was worse than the min-sum algorithm or better than the sum-product algorithm, and the average of many decodes performed better than the min-sum algorithm, but not as good as the sum-product algorithm. As a result, the adaptive sum-product approximation results in an improvement over the min-sum algorithm currently employed in the art, without the need for additional attenuation.

In various embodiments, the system of the present invention may be implemented in a Field Programmable Gate Array (FPGA) or Application Specific Integrated Circuit (ASIC) suitable for the design of encoders/decoders for LDPC codes.

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims not by the above detailed description.

What is claimed is:

1. A method for decoding low-density parity check (LDPC) encoded data, the method comprising:
receiving a plurality of log-likelihood ratios (LLRs) at a decoder, each of the plurality of LLRs representing one of a plurality of bits of an LDPC encoded codeword;
identifying a smallest LLR from the plurality of received LLRs, the smallest magnitude LLR having the smallest magnitude of the plurality of received LLRs;
identifying a second smallest LLR from the plurality of received LLRs, the second smallest LLR having the second smallest magnitude of the plurality of received LLRs that is equal to or greater than the smallest LLR;

determining an adaptive check node approximation of the bits of the encoded codeword using the smallest LLR and the second smallest LLR; and decoding the encoded codeword using the adaptive check node approximation of the bits of the encoded codeword to provide an estimate of the LDPC encoded codeword.

2. The method of claim 1, wherein receiving a plurality of LLRs further comprises, receiving the plurality of LLRs from a nonvolatile memory storage module.

3. The method of claim 1, wherein receiving a plurality of LLRs further comprises, receiving the plurality of LLRs at a check node processor of the decoder.

4. The method of claim 1, further comprising identifying a predetermined number of smallest LLRs from the plurality of received LLRs.

5. The method of claim 1, wherein determining the adaptive check node approximation using the using the smallest LLR and the second smallest LLR further comprises, accessing a look-up table comprising the sum-product approximations for all possible combinations of the smallest LLR and the second smallest LLR.

6. The method of claim 1, wherein determining the sum-product approximation using the using the smallest LLR and the second smallest LLR further comprises, accessing a reduced look-up table comprising the sum-product approximations for all possible combinations of the smallest LLR and a reduced number of the second smallest LLR.

7. The method of claim 1, wherein determining the adaptive check node approximation using the using the smallest LLR and the second smallest LLR further comprises, utilizing combinatorial decode logic to determine a sum-product approximation.

8. The method of claim 1, wherein decoding the encoded codeword using the adaptive check node approximation to provide an estimate of the LDPC encoded codeword further comprises:
performing check node processing utilizing the adaptive check node approximation and passing the check node approximation results to the associated variable nodes;
performing variable node processing for check node processing result; and
performing a check of the estimate of the LDPC encoded codeword to determine if the codeword estimate is a valid codeword.

9. The method of claim 8, further comprising, after performing a check of the estimate of the LDPC encoded codeword to determine if the codeword estimate is a valid codeword:
if the codeword estimate is a valid codeword, outputting the codeword estimate from the decoder; and
if the codeword estimate is not a valid codeword, initiating another iteration of the decoding process beginning with performing check node processing.

10. An LDPC decoder for decoding low-density parity check (LDPC) encoded data, the LDPC encoded data comprising a plurality of log-likelihood ratios (LLRs), each of the plurality of LLRs representing one of a plurality of bits of an LDPC codeword encoded using a parity check matrix, the decoder comprising at least one processor configured to perform variable node processing and check node processing, the at least one processor for determining an adaptive check node approximation of the LDPC codeword using a smallest magnitude LLR of the plurality of LLRs and a second smallest magnitude LLR of the plurality of LLRs that is equal to or greater than the smallest magnitude LLR.

11. The decoder of claim 10, wherein the at least one processor comprises a check node processor that further comprises:
an LLR magnitude identification circuit for identifying the smallest magnitude LLR and the second smallest magnitude LLR from the plurality of LLRs; and
a check node decode circuit coupled to the LLR magnitude identification circuit for determining the adaptive check node approximation of the codeword using the smallest LLR and the second smallest LLR identified by the LLR magnitude identification circuit.

12. The decoder of claim 10, wherein the LDPC decoder comprises a look-up table comprising the sum-product approximations for all possible combinations of the smallest magnitude LLR and the second smallest magnitude LLR.

13. The decoder of claim 12, wherein the look-up table is a reduced look-up table comprising the sum-product approximations for all possible combinations of the smallest LLR and a reduced number of the second smallest LLR.

14. The decoder of claim 10, wherein the at least one processor comprises a check node processor that comprises combinatorial decode logic to determine the sum-product approximation of the codeword.

15. The decoder of claim 10, wherein the at least one processor comprises a check node processor that determines the adaptive check node approximation of the LDPC codeword using a predetermined number of smallest magnitude LLRs of the plurality of LLRs.

16. The decoder of claim 10, wherein the at least one processor comprises a check node processor, the decoder further comprising:
a variable node processor coupled to the check node processor, the variable node processor having circuitry for performing variable node processing from the check node approximation results; and
a codeword estimate check processor coupled to the variable node processor, the codeword estimate check processor having circuitry for performing a check of the estimate of the LDPC encoded codeword to determine if the codeword estimate is a valid codeword.

17. The decoder of claim 16, further comprising circuitry for outputting the codeword estimate from the decoder if the codeword estimate is a valid codeword.

18. The decoder of claim 16, further comprising an iteration counter comprising circuitry for initiating another iteration of the decoding process beginning with performing check node processing if the codeword estimate is not a valid codeword.

19. An LDPC decoder for decoding low-density parity check (LDPC) encoded data, the LDPC encoded data comprising a plurality of log-likelihood ratios (LLRs), each of the plurality of LLRs representing one of a plurality of bits of an LDPC codeword encoded using a parity check matrix, the decoder comprising:
a check node processor for determining an adaptive check node approximation of the LDPC codeword using a smallest magnitude LLR of the plurality of LLRs and a second smallest magnitude LLR of the plurality of LLRs that is equal to or greater than the smallest magnitude LLR;
a variable node processor coupled to the check node processor, the variable node processor having circuitry for performing variable node processing using the adaptive check node approximation; and
a codeword estimate check processor coupled to the variable node processor, the codeword estimate check processor having circuitry for performing a check of the estimate of the LDPC encoded codeword to determine if the codeword estimate is a valid codeword.

20. The decoder of claim 19, wherein the check node processor further comprises:
- an LLR magnitude identification circuit for identifying the smallest magnitude LLR and the second smallest magnitude LLR from the plurality of LLRs; and
- a check node decode circuit coupled to the LLR magnitude identification circuit for determining the adaptive check node approximation of the codeword using the smallest LLR and the second smallest LLR identified by the LLR magnitude identification circuit.

* * * * *